United States Patent [19]

Schoberl

[11] 4,047,075
[45] Sept. 6, 1977

[54] ENCAPSULATED LIGHT-EMITTING DIODE STRUCTURE AND ARRAY THEREOF

[75] Inventor: Werner Schoberl, Massenbachhausen, Germany

[73] Assignee: Licentia-Patent-Verwaltungs-G.m.b.H., Frankfurt am Main, Germany

[21] Appl. No.: 662,086

[22] Filed: Feb. 27, 1976

[30] Foreign Application Priority Data

Mar. 1, 1975 Germany .............................. 2509047

[51] Int. Cl.² .................... H05B 33/12; H05B 33/16
[52] U.S. Cl. .................................. 313/500; 313/512; 357/72
[58] Field of Search ............... 313/499, 500, 501, 512; 357/72, 17, 74

[56] References Cited

U.S. PATENT DOCUMENTS

| 3,510,732 | 5/1970 | Amans | 313/501 X |
| 3,555,335 | 1/1971 | Johnson | 313/499 |
| 3,593,055 | 7/1971 | Geusic et al. | 313/501 |
| 3,694,902 | 10/1972 | Apgar et al. | 357/72 |
| 3,711,789 | 1/1973 | Dierschke | 313/500 X |
| 3,774,086 | 11/1973 | Vincent, Jr. | 357/74 |
| 3,805,376 | 4/1974 | D'Asaro et al. | 357/17 X |
| 3,869,704 | 3/1975 | Hunter et al. | 357/72 X |
| 3,919,585 | 11/1975 | Schorr | 313/512 X |

Primary Examiner—Palmer C. Demeo
Attorney, Agent, or Firm—Spencer & Kaye

[57] ABSTRACT

A light-emitting diode including a casing with two flat outer light-emitting opposite parallel sides connected by a curved outer surface.

13 Claims, 3 Drawing Figures

ENCAPSULATED LIGHT-EMITTING DIODE STRUCTURE AND ARRAY THEREOF

Background of the Invention

This invention relates to a light-emitting diode.

The light-emitting diodes known today produce, as is known, relatively small circular points of light.

Summary of the Invention

It is an object of the invention to create a light-emitting diode which is suitable for achieving large and uniformly illuminated surfaces.

According to a first aspect of the invention, there is provided a light-emitting diode comprising a semi-conductor light-emitting diode member and a casing surrounding said semi-conductor light-emitting diode body and defining two flat outer opposite parallel sides and a curved outer surface connecting said two flat outer opposite parallel sides.

According to a second aspect of the invention, there is provided a light-emitting diode, characterised in that the casing has two flat outer side surfaces which run parallel to one another and are opposite and that the outer upper surface connecting said two outer surfaces is curved.

Brief Description of the Drawings

The invention will now be described in greater detail, by way of example, with reference to the drawings, in which.

Description of the Preferred Embodiment

Basically, the invention proposes a light-emitting diode having a casing with two flat outer side surfaces which run parallel to one another and are opposite, and an outer upper light-emitting surface which connects these two outer surfaces and which is curved.

Besides the two stated outer surfaces another two outer side surfaces are preferably present which also run parallel to one another. The width of these outer surfaces is smaller than the width of the two other outer side surfaces. The upper outer surface of the casing is preferably curved outwards. The curvature of the upper outer surface is selected so that the light source acts on the observer as an area of uniform brightness. This is achieved, for example, by a curvature which extends substantially only in one direction. Preferably, then, the curvature runs from one of the two narrow outer surfaces to the other narrow outer surface.

The ratio between the width of the outer surfaces is for example between 1:2 and 1:4. The casing of the light-emitting diode according to the invention preferably has a rectangular cross-section.

The casing of the light-emitting diode of the invention preferably consists of plastic. This plastic material preferably contains a colouring matter for improving the contrast ratio between light and dark. In order to improve the uniformity of illumination, a glass powder, for example, may be added to the plastic material.

The light-emitting diodes of the invention may be arranged adjacent and in series without gaps in any direction. Owing to appropriate arrangement of the diodes adjacent and in series, graduations of light-emitting diodes, for example, XY matrix arrangements and similar arrangements may be produced.

Figure 1:
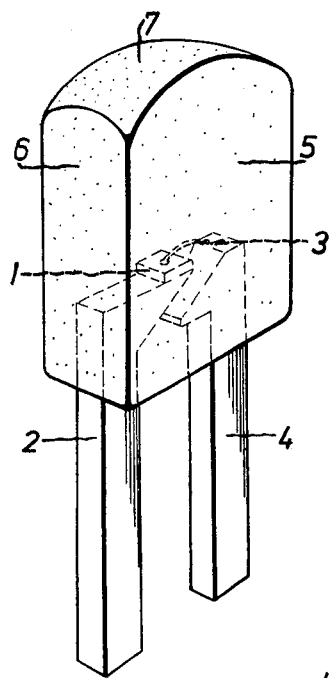
FIG. 1 shows a light-emitting diode in accordance with the invention.

Referrinfg now to the drawings, FIG. 1 shows a light-emitting diode according to the invention. The semiconductor member 1 of the light-emitting diode is arranged on a lead strip 2 according to FIG. 1, which may also be constructed as a reflector. The electrode located on the surface of the semi-conductor member 1 is contacted by a lead wire 3 to the lead strip 4.

The casing of the light-emitting diode of FIG. 1 consists of plastic and has a rectangular cross-section. Accordingly, the casing has two pairs of outer surfaces, 5 and 6, with the surfaces of each pair being parallel to one another. The upper outer light-emitting surface 7 is curved outwards and, in fact, such that it has the effect of a lens which brings about uniform illumination and makes an image of the light source in enlarged form. The curvature is present substantially only in one direction according to FIG. 1, and in fact the curvature is from one narrow outer surface 6 to the other narrow outer surface 6.

The plastic casing of the light-emitting diode is produced, for example, by casting or injection moulding. The plastic material, which consists for example of polycarbonate, is for example coloured in order to improve the contrast.

Moreover, the plastic material suitably contains glass powder in order to improve uniformity of illumination. The glass powder proportion amounts, for example, to 1 to 2%. The uniform illumination is further enhanced by a mixture of a scattering medium.

By means of appropriate smoothing of the outer surfaces, total reflection of light is achieved on the outer surfaces, which light passes from the inside of the casing to the outer surfaces. This effects acts positively, especially when several light-emitting diodes are arranged adjacent and in series according to FIGS. 2 and 3, since no light may pass over from the individual light-emitting diodes to adjacent light-emitting diodes. Therefore, so called "cross talk effect" between individual light-emitting diodes is prevented by means of the high smoothness of the outer surfaces of the casing. This means a further improvement in contrast.

Figure 2:
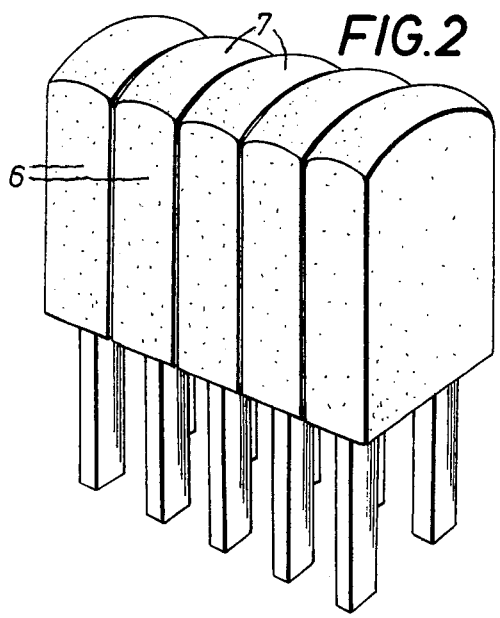
FIG. 2 shows several light-emitting diodes as shown in FIG. 1 in a series.
Figure 3:
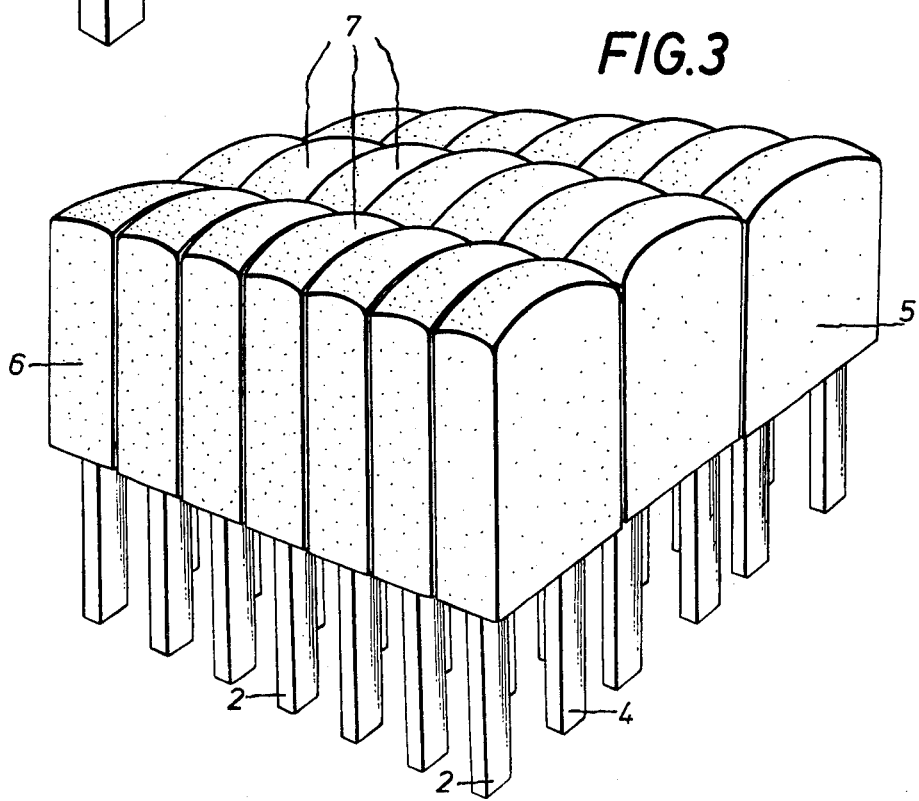
FIG. 3 shows a number of light-emitting diodes as shown in FIG. 1 in a package or matrix arrangement.

FIGS. 2 and 3 show the special advantage of the invention which consists in the fact that several light-emitting diodes may according to FIG. 2, be arranged adjacent and in series without gaps in a simple manner or, may according to FIG. 3, may be assembled to form a light-emitting package. In this manner large illuminated surfaces may be achieved which are uniformly illuminated. Triple colour assemblies, for example, are selected for graduation and matrix arrangement with the colours red, green and yellow.

It will be understood that the above description of the present invention is susceptible to various modification changes and adaptations.

What is claimed is:

1. In a light-emitting diode structure including a housing formed of a plastic material and having a light-emitting surface, and a semiconductor light-emitting diode embedded in said housing opposite and spaced from said light-emitting surface, the improvement wherein: said plastic housing has a rectangular cross section formed by first and second pairs of opposed parallel flat outer side surfaces; and said light-emitting surface is an outwardly curved end surface of said housing which extends to each of said side surfaces and is curved so that its surface area presents an area of uniform brightness to an observer.

2. A light-emitting diode structure as defined in claim 1 wherein said first pair of opposed parallel flat outer side surfaces have a width which is less than the width of said second pair of opposed parallel flat outer side surfaces.

3. A light-emitting diodes as defined in claim 2, wherein said light-emitting end surface is curved substantially only in one direction.

4. A light-emitting diode as defined in claim 3, wherein the curvature of said end surface runs between the said outer surfaces of said first pair of outer surfaces.

5. A light-emitting diode as defined in claim 4, wherein: said plastic material has a refractive index greater than 1.5; and said outer surfaces are smoothed as much as possible.

6. A light-emitting diode array comprising a plurality of light-emitting diode structures as defined in claim 5 adjacent one another without any gaps therebetween and arranged in rows and columns whereby an array with a surface which can be uniformly illuminated is provided.

7. A light-emitting diode as defined in claim 1, wherein said plastic material has a refractive index greater than 1.5.

8. A light-emitting diode as defined in claim 7, and comprising glass powder in said plastics material for improving uniformity of illumination.

9. A light-emitting diode array comprising a plurality of light-emitting diode structures as defined in claim 7 adjacent one another without any gaps therebetween and arranged in rows and columns whereby an array with a surface which can be uniformly illuminated is provided.

10. A light-emitting diode as defined in claim 1, wherein said plastic material includes colouring matter in order to increase the contrast ratio between light and dark.

11. A light-emitting diode as defined in claim 10, wherein in order to achieve a yellow, orange and red illuminating colour, colour pigments are used such that an edge filtering effect arises, which absorbs shorter wave light in each case than the said illuminating colours.

12. A light-emitting diode as defined in claim 10, wherein in order to achieve a green or shorter wave illuminating colours, the colour pigments are used such that the effect of an interference filter is formed so that the maximum interference effect is dependent on the wavelength of the respective illuminating colour.

13. A light-emitting diode structure as defined in claim 1 wherein said plastic material is a polycarbonate.

* * * * *